United States Patent [19]
Aronowitz et al.

[11] Patent Number: 5,893,952
[45] Date of Patent: Apr. 13, 1999

[54] APPARATUS FOR RAPID THERMAL PROCESSING OF A WAFER

[75] Inventors: Sheldon Aronowitz; Nicholas Eib; Jon S. Owyang, all of San Jose, Calif.

[73] Assignee: LSI Logic Corporation, Milpitas, Calif.

[21] Appl. No.: 08/954,791

[22] Filed: Oct. 21, 1997

Related U.S. Application Data

[62] Division of application No. 08/678,718, Jul. 11, 1996, Pat. No. 5,756,369.

[51] Int. Cl.$^6$ .................................................. C23C 16/00
[52] U.S. Cl. ........................ 118/725; 118/724; 118/666; 118/712; 118/713
[58] Field of Search ............................. 118/724, 725, 118/666, 712, 713; 219/759, 678

[56] References Cited

U.S. PATENT DOCUMENTS

| | | | |
|---|---|---|---|
| 4,151,008 | 4/1979 | Kirkpatrick | 148/1.5 |
| 4,308,078 | 12/1981 | Cook | 148/1.5 |
| 4,374,678 | 2/1983 | Castro | 148/1.5 |
| 4,376,659 | 3/1983 | Castro | 148/1.5 |
| 4,456,490 | 6/1984 | Dutta et al. | 148/1.5 |
| 4,517,026 | 5/1985 | Inoue | 148/1.5 |
| 4,752,454 | 6/1988 | Pastor et al. | 423/19 |
| 4,806,321 | 2/1989 | Nishizawa et al. | 422/245 |
| 4,979,134 | 12/1990 | Arima et al. | 364/557 |
| 5,014,646 | 5/1991 | Ito et al. | 118/725 |
| 5,122,223 | 6/1992 | Geis et al. | 156/603 |
| 5,304,357 | 4/1994 | Sato et al. | 422/250 |
| 5,436,172 | 7/1995 | Moslehi | 437/8 |
| 5,540,783 | 7/1996 | Eres et al. | 118/725 |
| 5,564,830 | 10/1996 | Bobel et al. | 374/126 |
| 5,580,801 | 12/1996 | Maegawa et al. | 437/40 |
| 5,756,369 | 5/1998 | Aronowitz et al. | 438/16 |

OTHER PUBLICATIONS

D. Maydan, Micromachinig and Image Recording on Thin Films by Laser Beams, The Bell System Technical Journal, and pp. 1761–1789.

*Primary Examiner*—Bruce Breneman
*Assistant Examiner*—Jeffrie R Lund

[57] ABSTRACT

Rapid Thermal Processing of a semiconductor wafer is performed by scanning a laser beam across a silicon dioxide film in contact with a surface of the wafer. The silicon dioxide film absorbs the energy from the laser beam and converts the energy to heat. The heat, in turn, is transferred to the wafer. Temperature feedback can be obtained to increase control and uniformity of temperatures across the wafer.

20 Claims, 4 Drawing Sheets

APPARATUS FOR RAPID THERMAL PROCESSING OF A WAFER

CROSS-REFERENCE TO RELATED APPLICATION

This is a divisional of application Ser. No. 08/678,718, filed Jul. 11, 1996 now U.S. Pat. No. 5,756,369.

BACKGROUND OF THE INVENTION

The invention relates in general to semiconductors and in particular to rapid thermal processing of semiconductor devices.

During fabrication of a semiconductor device such as a transistor, N-type and P-type regions are formed in a wafer made of semiconductor material. High velocity streams of gases containing dopant atoms are directed onto the wafer, causing dopant atoms to be implanted below the wafer's surface. Donor-type dopant atoms such as phosphorus are used to form the N-type regions, and acceptor-type dopant atoms such as boron are used to form the P-type regions. The wafer is heated to temperatures approaching 1000° C., allowing the dopant atoms to diffuse into the crystalline matrix of the semiconductor material and occupy free lattice spaces. The dopant atoms that occupy the free is lattice spaces become electrically active.

The electrical characteristics of the semiconductor device are dependant upon how precisely the N-type and P-type regions are formed. Precise depth, length and width of the regions allow the device to operate according to specification. When the dimensions of a region change, the electrical characteristics of the device deviate from the specification. The step of heating the wafer is critical to precise formation of the N-type and P-type regions. For example, if too high a temperature is applied to the wafer, or if the wafer is heated for too long a period of time, the dopants will diffuse more than they should. As a result, the dimensions of the regions will change and the electrical characteristics of the semiconductor device will deviate.

The wafer can be heated in an annealing furnace. Activation temperatures ranging between 800° C. and 1000° C. can be achieved within 30 minutes. The problem with furnace annealing is that the long heating period allows the donor-type and acceptor-type dopant atoms to diffuse and the dimensions of the N-type regions and P-type regions to change.

In the alternative, the wafer can be heated by rapid thermal processing (RTP). RTP is performed with a Halogen lamp and a parabolic reflector. The Halogen lamp generates broadband radiation, and the parabolic reflector focuses the broadband radiation onto the wafer. Activation temperatures can be reached in less than one minute. Thus, RTP can reach the activation temperatures far more quickly than furnace annealing.

One difficulty encountered with Halogen lamps is achieving and maintaining temperature uniformity and controllability across the wafer. Only certain wavelengths in the IR spectrum can be used to heat the wafer. Yet the Halogen lamp generates many different wavelengths at random, and intensities of the is useful wavelengths fluctuate. The wavelengths range from ultraviolet to visible to infrared. The wavelength distribution is not uniform and cannot be controlled. Consequently, the rise and fall times of the activation temperature cannot be controlled precisely.

Mere usage of the lamp also contributes to variations in the wavelength distribution. Thus, constant usage of the Halogen lamp diminishes the ability to control the activation temperature. Additionally, the parabolic reflector itself contributes to the lack of controllability. Design of the parabolic reflector is not precise; it is determined empirically.

Achieving and maintaining temperature uniformity and controllability is further complicated by the different types of materials (e.g. photoresist, dopants) on the surface of the wafer. Heating of the different materials is very sensitive to the optical reflectivity and thermal conductivity of the semiconductor material. As a result, the same RTP apparatus could heat different wafers to different temperatures.

This lack of controllability and uniformity of temperatures during RTP affects the ability to form precise regions in the wafer.

SUMMARY OF THE INVENTION

Controllability and uniformity of the wafer's temperature is achieved by an apparatus and method according to the present invention. A method of heating the wafer comprises the steps of placing a film in contact with the wafer; and directing a beam of narrowband energy onto the film such that the film absorbs the energy and transfers heat to the wafer.

A method of measuring temperatures of a wafer during rapid thermal processing comprises the steps of reflecting a beam off the wafer; analyzing the reflected beam by interferometry to determine displacement of the wafer; and determining the temperature of the wafer as a function of the displacement.

A method of forming a layer on a semiconductor substrate having a frontside and a backside, comprises the steps of placing a film of material in contact with the backside of the substrate; directing a beam of narrowband energy onto the film such that the film absorbs the energy and transfers heat to the substrate; controlling temperatures across the backside of the substrate; and performing an additive process on the frontside of the substrate.

Apparatus for rapid thermal processing of the wafer comprises an IR window; an absorption film in thermal communication with the wafer; a source of narrowband electromagnetic energy; and a scanner operable to scan a beam of the energy from the source through the IR window and across a surface of the film. The energy from the beam is absorbed by the film, and heat generated by the film is transferred to the wafer.

DETAILED DESCRIPTION OF THE PREFERRED EMBODIMENTS

Figure 1:
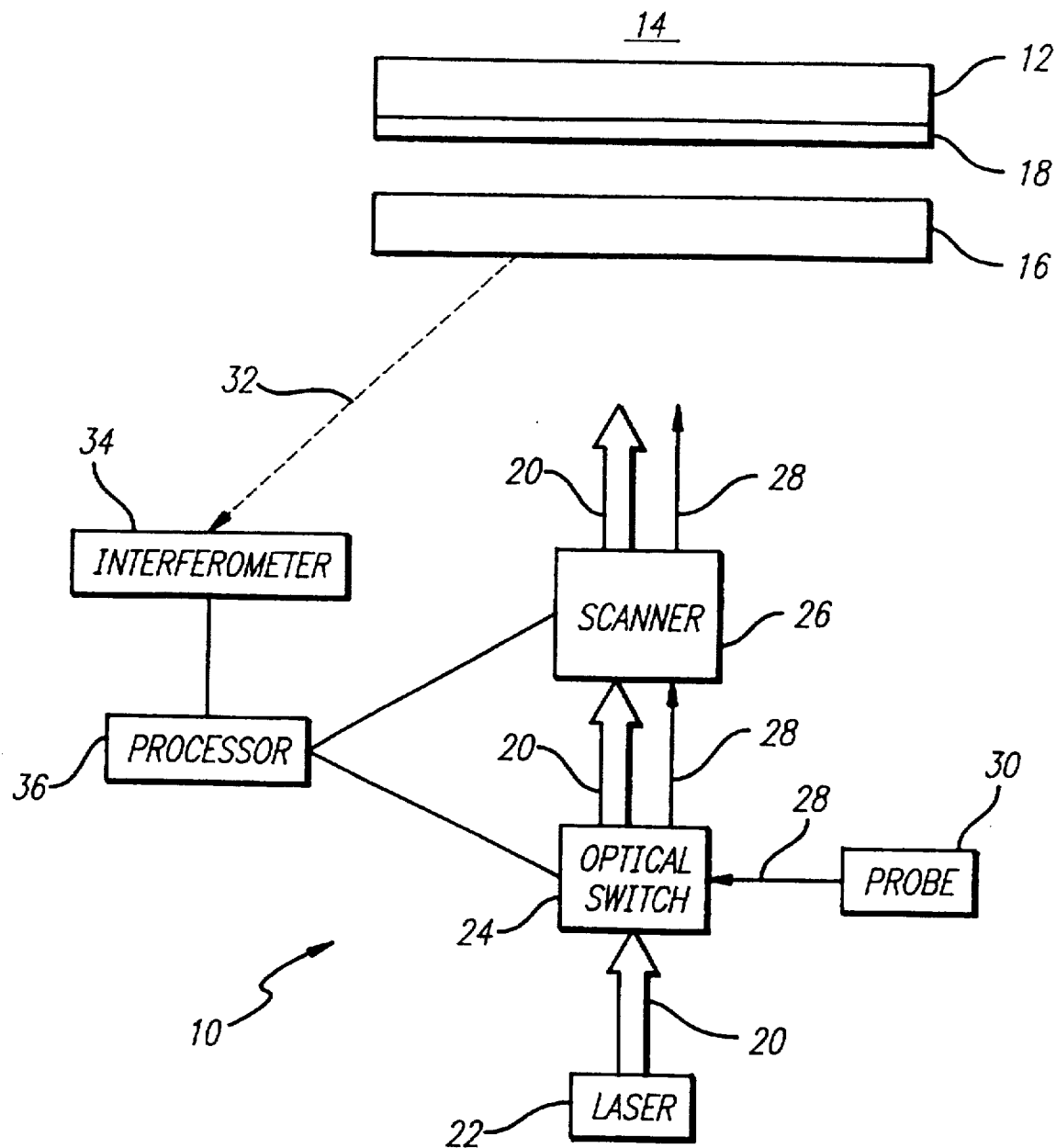
FIG. 1 is a block diagram of a first embodiment of apparatus for rapid thermal processing according to the present invention.

Referring now to FIG. 1, apparatus 10 for performing rapid thermal processing (RTP) of a silicon wafer 12 includes a chamber 14 that holds the wafer 12 in an inert gas and an environment that is free of particles. The chamber 14 can be of a conventional design. The chamber 14 includes a chuck (not shown) that supports the wafer 12 in a manner that minimizes thermal contact with the chamber 14. A vacuum should be maintained inside the chamber 14. The vacuum minimizes convection air currents inside the chamber 14. An IR window 16 is positioned behind the wafer 12, and a thin absorption film 18 is placed between the wafer 12 and the IR window 16. A narrowband beam 20 of electromagnetic radiation is generated by a high-wattage laser 22 and transmitted by an optical switch 24, such as a combiner, to an optical scanner 26. The optical scanner 26 rapidly scans the beam 20 through the window 16 and across the absorption film 18. Energy from the beam 20 is absorbed by the absorption film 18 which, in turn, heats the wafer 12 to temperatures sufficient for rapid thermal processing. Dopant atoms that have been implanted into the wafer 12 are diffused to form electrically active regions.

For maximum controllability, the beam 20 should be a point source having a very narrow bandwidth. The wavelength of the beam 20 is in the long wave infrared (LWIR) band. A $CO_2$ laser, for example, emits beams at 10.4 microns and 9.2 microns, which is in the middle of the normal IR spectra range (i.e., 400 to 4000 cm$^{-1}$). Required power of the laser 22 depends upon the thermal characteristics of the wafer 12. Silicon wafers are typically 150 mm in diameter and 650 microns thick for a volume of 11.5 cm$^3$. With the density of silicon being 2.33 g/cm$^3$, the weight of a typical silicon wafer is 26.8 g. Heat capacity of the silicon is 0.703 J g$^{-1}$ °K$^{-1}$ (see Eib and Kvitek, "Thermal Distribution and the Effect on Resist Sensitivity in Electron-beam Direct Write", J. Vac. Sci. Technol, B7(6), Nov/Dec 1989, p 1502–1506). Therefore, a typical wafer must absorb 18.8 J to raise its temperature by 1° K. Since one Joule equals 1 watt second, a 250 watt $CO_2$ laser can heat a typical wafer at a rate of 13 degrees per second (an optical lamp, in contrast, can heat a typical wafer at a rate of 10 degrees per second). Using the 250 watt $CO_2$ laser, the wafer 12 is heated for approximately 1.5 minutes to 1000° C. (not considering energy that is absorbed/reflected by the IR window 16 and reflected by the absorption film 18). Activation temperatures can be reached within a matter of microseconds.

The IR window 16 is made of silicon, germanium, or any other material that transmits the LWIR beam. Silicon is transparent at 9.2 microns. The IR window 16 has a thickness of approximately 0.5 mm and a diameter that depends upon the location of the scanner 26. If the scanner 26 is located inside the chamber 14, the IR window 16 can have a smaller diameter than the wafer 12. If the scanner 26 is located outside the chamber 14, the IR window 16 should have a diameter as great as, or greater than, the diameter of the wafer 12. An IR window made of silicon can be easily grown to twelve inches in diameter.

The absorption film 18 is made of a material that absorbs substantially all of the energy from the narrowband beam 20. That is, the absorption characteristics of the film 18 are matched to the wavelength of the narrowband beam 20. The absorption film 18 must have sufficient thickness to prevent the beam 20 from being transmitted directly to the wafer 12. Yet the absorption film 18 must not be too thick; otherwise it will not heat up rapidly enough for RTP. Moreover, the film 18 should not degrade over time. The film 18 should not bubble, sputter or degas every time it is heated up. In fact, degradation should be avoided; otherwise, non-uniform absorption will result. Thus, the choice of materials for the absorption film 18 is limited.

The absorption film 18 can be a 1–2 micron film of silicon dioxide that is oxidized onto the back of the wafer 12. The refractive index of silicon dioxide is 2.2–i2.42 at 9.2 microns (see Aronowitz and Michelangelo Delfino, "Laser Activated Glass Flor Modeling", Mat. Res. Soc., Symp. Proc., Vol 71, 1986, p. 479–85). This translates into an absorption of 94% per micron of thickness. Such absorption allows the silicon dioxide film to be very thin. The silicon dioxide film can be grown using conventional techniques. The 1–2 micron thickness of the silicon dioxide film prevents the beam 20 from being transmitted directly to the wafer 12, yet it allows for a fast buildup of energy necessary for RTP. Moreover, the silicon dioxide film does not degrade over time.

Scanning the beam 20 across the absorption film 18 provides for a uniform temperature distribution across the wafer 12. A scanner 26 including two mirrors oscillated by stepper motors or linear motors (which are faster) can create a serpentine scan pattern. This is the simplest scan pattern. A more complex pattern is a raster scan, in which the beam 20 is moved from point to point on the film 18. The dwell time or energy of the beam 20 can be modified at each point. The raster scan is especially valuable to compensate for geometric edge effects. The raster scan also compensates for thermal conductivities and emissivities of silicon dioxide, silicon and the materials on the surface of the wafer 12. The thermal conductivities are all functions of temperature.

Even greater control over the wafer's temperature is obtained from feedback. Knowing the actual temperature of the wafer surface allows the laser 22 to focus energy at specific locations on the wafer 12 in order to create a more uniform temperature distribution. For example, energy can be focused on the edges of the wafer 12, which tend to cool faster than the center of the wafer 12. Or, the energy can be focused at a point until a desired temperature for that point is reached.

Temperature feedback can be obtained by directing a beam 28 of visible light from a probe laser 30 onto the absorption film 18 or the wafer 12. The visible light has a wavelength ranging between 0.4 and 0.8 microns. The probe laser 30 can be a diode laser. The optical path of the beam 28 goes from the optical switch 24, to the optical scanner 26, through the IR window 16 and onto the absorption film 18. The IR window 16 transmits both the beam 28 from the probe laser 30 and the beam 20 from the $CO_2$ laser. The beam 28 from the probe laser 30 is scanned across the wafer 12.

If the IR window 16 does not transmit the beam 28 from the probe laser 30, a separate optical window can be used. The optical window can be an A1203 (optical sapphire) window that is transparent from 0.2 micron to 0.5 micron at 850 transmission. In the alternative, the window 16 can be a combination IR/optical window (e.g. AgCl). Such combination windows are environmentally tough and not particularly expensive.

The optical alignment can be perpendicular to the surface of the wafer 12 for maximum power transfer and ease of probe laser thickness measurement. However, the visible beam 28 from the probe laser 30 need not be perpendicular if separate IR and optical windows are chosen. Only the narrowband beam 20 from the laser 22 should be perpendicular; the visible beam 28 from the probe laser 30 can be glancing.

A portion of the visible beam 28 is reflected by the wafer 12 or absorption film 18, and the reflected beam 32 is detected by a standard interferometer 34. The interferometer 34 measures the change in thickness of the absorption film 18 and generates a signal indicating the change in thickness. The signal is supplied to a signal processor 36, which uses the Coefficient of Thermal Expansion (TEC) of silicon dioxide to determine the temperature of the absorption film 18 at each point of measurement. The TEC has been empirically modeled as follows:

$$TEC=(1.398E\text{-}06)+(1.133E\text{-}07*T)-(3.021E\text{-}13*T^2)+(3.710E\text{-}13*T^3)-(1.197E\text{-}16*T^4)$$

Given the thermal conductivity of the silicon, the signal processor 36 then determines the temperatures across the wafer 12. Measurements can be taken across the entire surface of the wafer 12.

Clearly, the temperature feedback allows for even greater control of temperature uniformity across the wafer 12. Greater control, in turn, allows the doped regions of the wafer 12 to be formed with greater precision.

Figure 2:
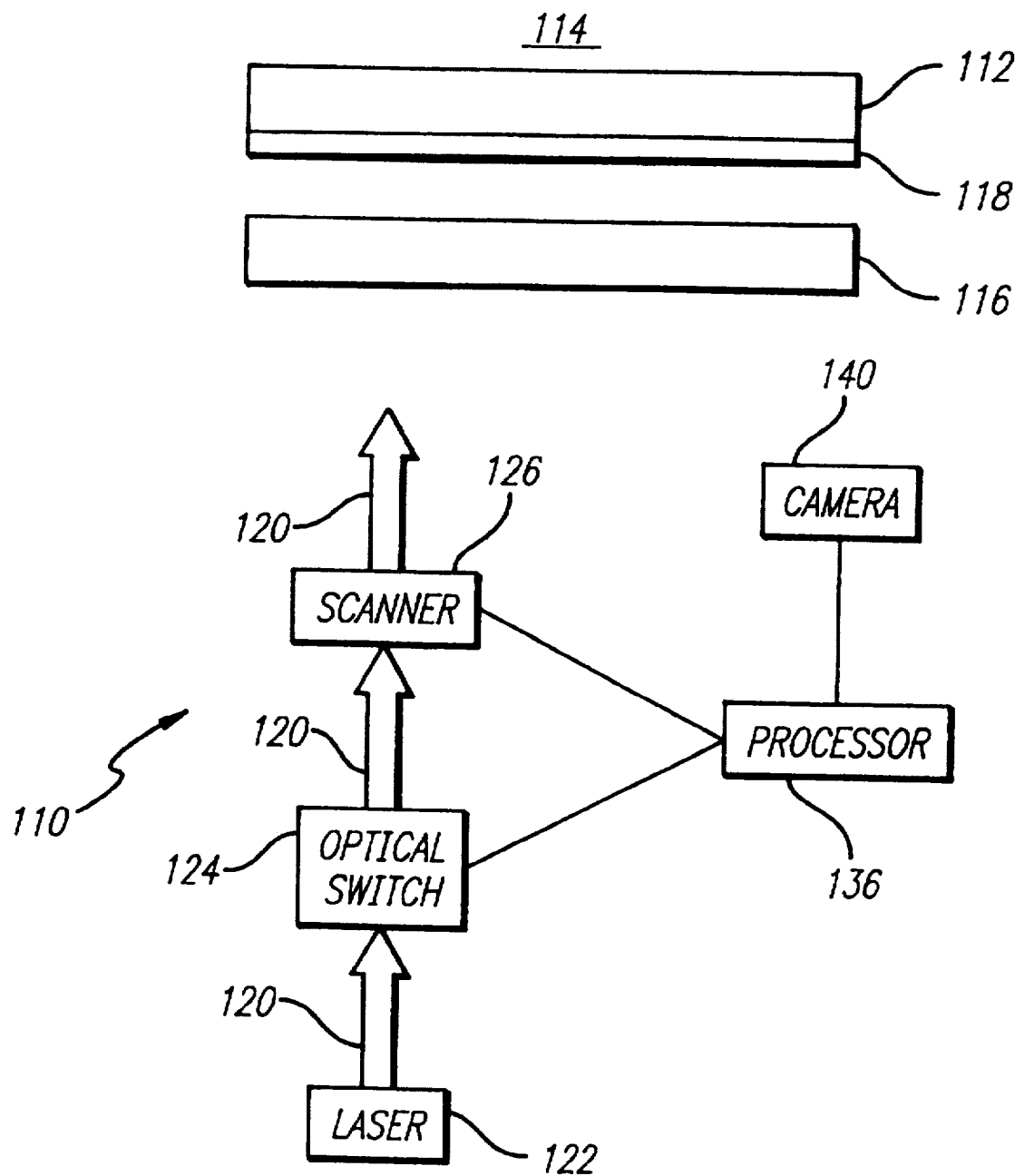
FIG. 2 is a block diagram of a second embodiment of apparatus for rapid thermal processing according to the present invention.
Figure 3:
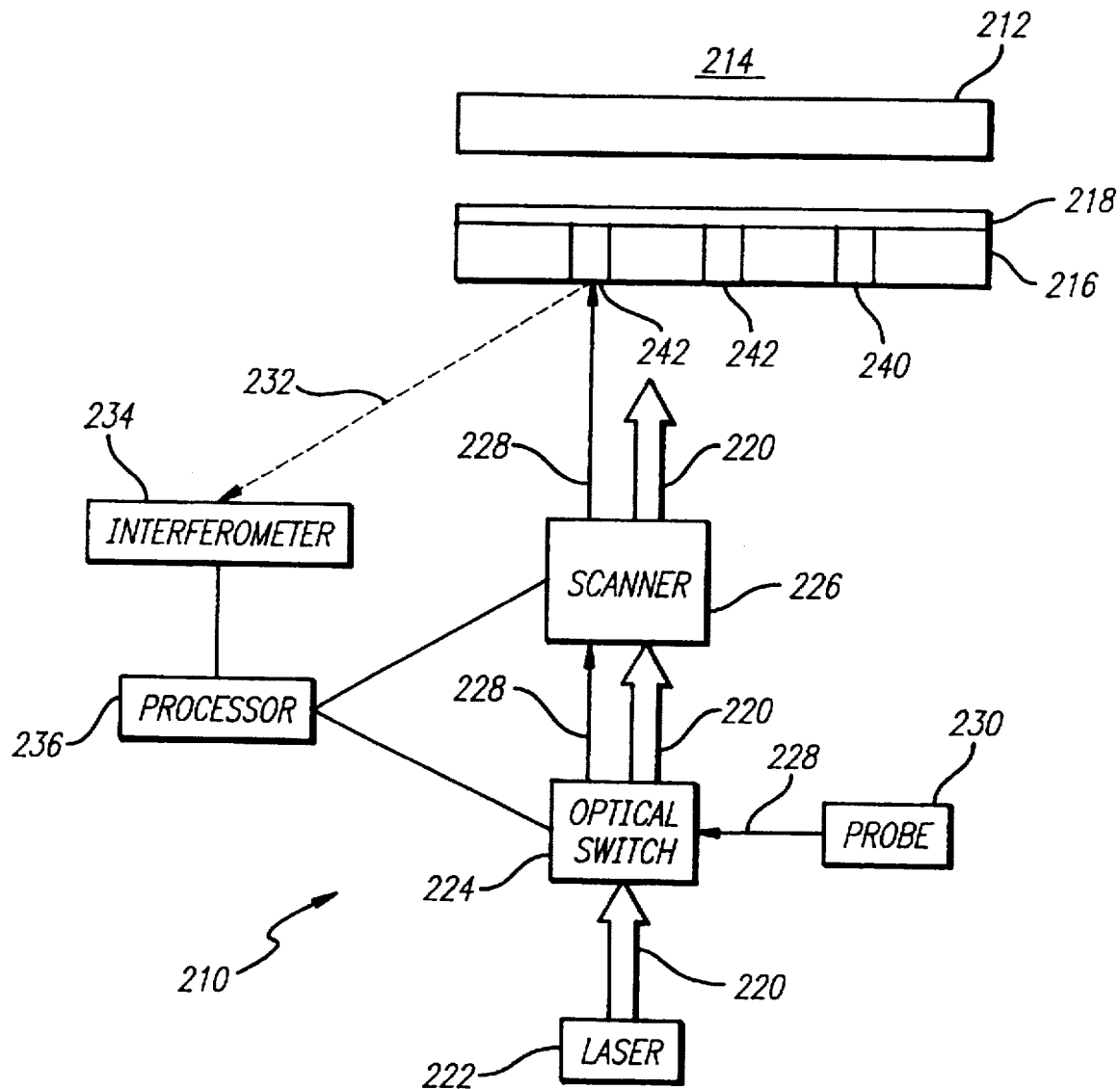
FIG. 3 is a block diagram of a third embodiment of apparatus for rapid thermal processing according to the present invention.
Figure 4:
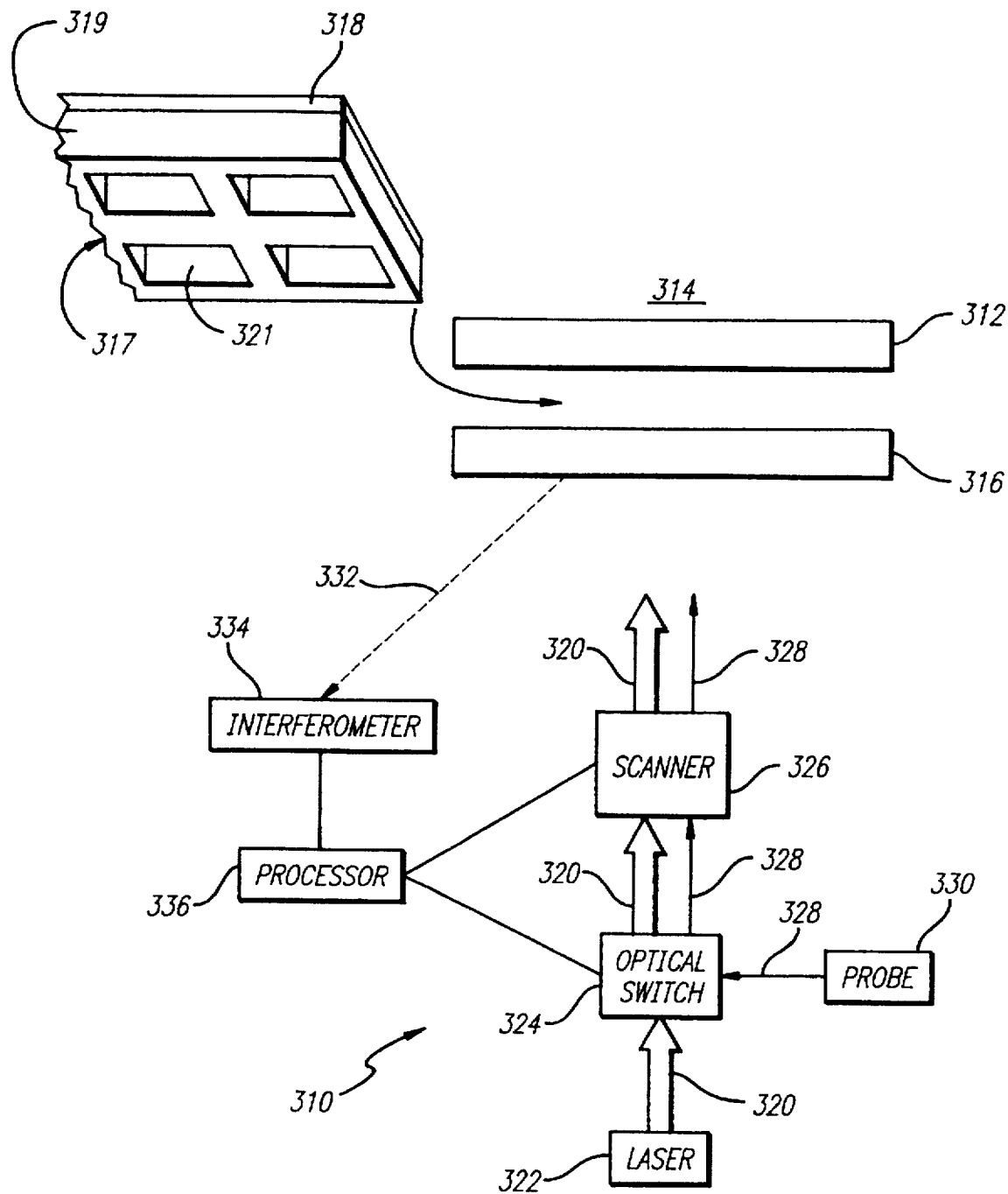
FIG. 4 is a block diagram of a fourth embodiment of apparatus for rapid thermal processing according to the present invention.

FIGS. 2, 3 and 4 show alternative embodiments of the present invention. Reference numerals of elements shown in FIGS. 2, 3 and 4 have been increased by one hundred, two hundred and three hundred, respectively, over the reference numerals of corresponding elements shown in FIG. 1. The elements in FIGS. 2, 3 and 4 are the same as their corresponding elements of FIG. 1, except as indicated below.

Referring to FIG. 2, an RTP apparatus 110 uses an IR camera 140 instead of the probe laser 30 and interferometer 34. The IR camera 140 is used to directly measure the temperature of the absorption film 118, giving a detailed map, pixel-by-pixel, of the wafer 112. IR cameras sensitive to long wave (3 to 5 micron) and medium wave (9 to 12 micron) infrared radiation are commercially available.

A signal processor 136 controls a laser 122 and an optical scanner 126 to create a uniform temperature distribution along a wafer 112. The feedback from the IR camera 140 is ideal for a raster scan. The pixel-by-pixel map is used to control the dwell time and power output of the laser 122. The processor 136 compares each temperature measured at a point to a desired temperature for that point, and commands the power and dwell time of the laser 122 to achieve the desired temperature. The desired temperatures do not have to be obtained in a single pass; they can be obtained over several passes.

Referring now to FIG. 3, an RTP apparatus 210 uses an absorption film 218 of silicon dioxide that is grown onto an IR window 216. The IR window 216 contains a first set 240 of perforations having widths between one and two millimeters. Extending entirely through the IR window 216 and the absorption film 218, the perforations of the first set 240 are located uniformly across the IR window 216. The first set 240 of perforations allow the IR window 216 to be held against a wafer 212 via vacuum pressure. Good thermal contact against the absorption film 218 should be assured for rapid and uniform heating. The pressure in the chamber 214 should be less than one atmosphere to minimize convection heat loss yet allow for the good thermal contact.

A laser 222, optical switch 224 and optical scanner 226 are used to direct a laser beam 220 onto the absorption film 218. Temperature feedback can be obtained through the use of a probe laser 230, interferometer 234 and processor 236. To allow a beam 228 from the probe laser 230 to reach the film 218, a second set 242 of perforations is provided. The perforations of the second set 242 extend entirely through the IR window 216 but do not extend through the absorption film 218. The perforations of the second set 242 can be between one and two millimeters wide. If the perforations of the second set 242 are too small, alignment problems might occur.

Feedback can, be obtained instead by a processor and IR camera (such as the processor 136 and camera 138 shown in FIG. 2). The IR camera does not require the second set 242 of the perforations in order to obtain feedback.

Referring now to FIG. 4, an RTP apparatus 310 uses a plate 317 that absorbs energy from a laser beam 320. The plate 317 includes an absorptive film 318 and a support 319 for the film 318 (a silicon dioxide film having a thickness of three microns and a diameter of 20 millimeters is too thin to be freestanding). The plate 317 is sandwiched between the wafer 312 and an IR window 316, with the film 318 making good thermal contact against the substrate 312. This allows heat generated by the film 318 to be transferred to the substrate 312. Vacuum pressure can be used to hold the plate 317 between the substrate 312 and the IR window 316.

The plate 317 can be fabricated as follows. A two to three micron layer of silicon dioxide (the film 318) is grown on one side of a silicon substrate (the support 319). Photoresist is applied to the other side of the substrate, and a window-like pattern is removed from the photoresist. Exposed portions of the silicon substrate are wet-etched down to the film 318 to form windows 321. The windows 321, which should be between one and two millimeters wide, allow the IR energy from the beam 320 to reach the film 318. The remaining silicon substrate provides support for the film 318.

Different types of supports could allow for different absorptive materials to be used, materials that cannot be grown on silicon or that are too thin to stand alone. For example, a honeycomb mesh constructed of wire could be used as a support, and a film of quartz having a thickness between two and three microns could be deposited on one side of the mesh. However, the mesh should be constructed such that the wires do not interfere with laser energy transmission to the film 318, do not act as a heat sink, and do not disturb temperature uniformity.

The apparatus 310 uses a probe laser 330, interferometer 334 and processor 336 to obtain temperature feedback. However the IR camera and processor shown in FIG. 2 could be used instead.

Both the IR window 216 carrying the absorption film 218 and the plate 317 carrying the absorption film 318 offer several advantages over the wafer 12 carrying the absorption film 18. One advantage is freedom of orientation. The IR window 216 carrying the absorption film 218 can be moved relative to the wafer 212. The plate 317 carrying the absorption film 318 can be moved relative to the wafer 312 and the IR window 316

Another advantage is the ability to change heating profiles. Films 218 and 318 of differing thicknesses would allow for different heating profiles to be applied to the substrates 212 and 312. Heating profiles could be changed by substituting IR windows 216 carrying absorption films 218 of different thicknesses. Similarly, heating profiles could be changed by substituting plates 317 carrying films 318 of different thicknesses. For example, a first plate could be used for activation temperatures of 750° C., while a second plate carrying a thinner absorption film could be used for activation temperatures of 1000° C. This advantage offers a unique degree of freedom.

Thus disclosed are apparatus and methods that achieve and maintain controllable and uniform temperature across a wafer during RTP. Temperatures can be controlled over milliseconds land even microseconds. In fact, the control is so precise over one micron level portions of the wafer that temperature variations in predetermined regions can be introduced. Such control cannot be exercised by Halogen lamps and parabolic reflectors. The apparatus and methods are extremely useful where thermal budget and high uniformity are considerations for semiconductor device fabrication.

The apparatus and method also allow RTP to be used for semiconductor fabrication processes other than annealing. RTP techniques using broadband energy from Halogen lamps cannot be applied to processes such as deposition, conversion and contact formation. This is because the broad spectrum of frequencies from a Halogen lamp causes molecules on the wafer to be excited and the processes to be altered. Moreover, the chemical reactions during such processes are temperature dependent and will, therefore, be different from region to region. Different regions have different structural characteristics (e.g., an edge, a raised surface, a contact-to-via) which cause temperature differences. Additionally, different chemicals have different absorbtivities which affect the temperatures of different regions.

In contrast to the Halogen lamp, the laser emits narrowband energy that does not cause the molecules to be excited. Thus, the narrowing of the spectrum eliminates undesired chemical reactions. Moreover, feedback allows temperatures to be controlled from region to region, regardless of the different absorbtivities of the chemicals and the different structures on the wafer. These factors allow the apparatus and methods to be used for depositions, oxidations, nitridations, conversions, contact formations and other additive processes.

The additive processes are conventional. That is, no changes to well-known additive processes are required, other than how the substrate is heated.

For example, the RTP apparatus can be used for the formation of gate oxides, which involves oxidation. Before a gate oxide is grown on a substrate, the active surface of the substrate is etched to remove any residual oxide. Then the gate oxide is grown using a dry oxidation in wet $O_2$. As the gate oxide is being grown, the RTP apparatus heats the wafer to a temperature of approximately 1000° C. Low temperature oxides can be deposited using Ozone-TEOS. As the low temperature oxide is being grown, the RTP apparatus heats the wafer to a temperature of approximately 800° C. The gate oxide must be thin, uniform and free of defects. In fact, integrity of the gate oxide is essential to device performance. Defects and variations in thickness of the gate oxide tend to shorten the lifetime of the device. The precise temperature control of the RTP apparatus allows for very thin, uniform and defect-free gate oxides to be formed.

The RTP apparatus can be used for the formation of metal-to-silicon contact structures in devices having relatively deep junctions. Before forming a metal-to-silicon contact structure, the regions where the contacts are to be formed is doped heavily. Then, a window is etched into an oxide covering the region until the region is exposed. A metal such as aluminum is deposited onto the wafer surface such that it makes contact with the silicon through the window. Then the wafer is heated using the RTP apparatus. Heating the substrate to temperatures above 400° C. allows the metal atoms to diffuse into the silicon, thereby bringing the metal into intimate contact with the silicon. Aluminum diffuses very rapidly into the silicon. If temperatures are not properly controlled, too much aluminum could diffuse into the silicon and create a junction spike. The junction spike causes large current leaks in the device, and may even short the device. By controlling the temperatures with precision, the RTP apparatus prevents the junction spikes from forming.

Instead of using pure aluminum, metal silicides such as aluminum silicide (AlSi) and platinum silicide (PtSi) can be used. The metal silicides are formed by solid-solid metallurgical reactions. Although the metal silicides prevent junction spiking in deep junction devices, devices having shallow junctions and small contacts are still susceptible to spiking. By controlling the wafer temperatures with precision, the RTP apparatus prevents spiking in devices having shallow junctions and small contacts.

The RTP apparatus can also be used for the formation of self-aligned silicide ("salicide") contacts, which involves conversion. The salicide contacts are formed as follows. After the source and drain regions have been implanted, polysilicon sidewall spacers are formed. Then, a refractory metal such as titanium silicide ($TiSi_2$) is deposited. The wafer is heated, which causes the silicide reaction to occur only at locations where the metal is in contact with the silicon. Everywhere else (including the sidewall spacers), the metal remains unreacted or converted to tin. The unreacted metal is selectively removed, leaving silicide films covering the gate, source and drain regions. A dielectic layer is deposited onto the silicide, and contact holes are opened to expose the underlying silicide layer. Lastly, a metal such as aluminum is deposited in the contact holes to make contact with the silicide. Titanium silicide is most widely used for salicide contacts because it can form a suilcide on single-crystal silicon as well as polysilicon. This allows the suicides at the drain and source regions to be formed at the same time as the polycides (i.e., polysilicon covered with the refractory metal silicide) at the gate region. The RTP apparatus controls the temperatures precisely during conversion to prevent the titanium from reacting with the spacers and forming titanium oxides.

Other salicide structures can use group VIII silicides such as $Pd_2Si$, $CoSi_2$ and $NiSi_2$. The group VIII elements become unstable at temperatures above 900° C. so, once again, precise temperature control is important.

The RTP apparatus could also be used for the formation of oxy-nitrides which also involves conversion. The oxy-nitrides can be used as gate oxides. After the surface of the active area is wet-etched to remove any native oxide, the oxy-nitride is grown in an ambient such as $NH_3$, $N_2O$ or NO. Formation of an oxy-nitride requires rapid heating of the wafer to high temperatures, followed by rapid cooling of the wafer. Demanding profiles of 1% to 6% $N_2$ for heating and cooling the wafer can be achieved by the RTP apparatus.

It is understood that various changes and modifications may be made without departing from the spirit and scope of the invention. For example, more than one probe laser can be used to give better control of temperatures across the wafer. It is also understood that the apparatus and method are not limited to silicon wafers, but can be applied to any type and size of semiconductor wafer. Accordingly, the present invention is not limited to the precise embodiment described hereinabove. Instead, it is defined by the claims that follow.

We claim:

1. Apparatus for rapid thermal processing of a wafer comprising:

an IR window;

an absorption film in thermal communication with the wafer;

a source of narrowband electromagnetic energy; and a scanner operable to scan a beam of the energy from the source through the IR window and across a surface of the film, the energy from the beam being absorbed by the film, heat generated by the film being transferred to the wafer.

2. The apparatus of claim 1, wherein the source includes a $CO_2$ laser.

3. The apparatus of claim 1, wherein the IR window is perforated, and wherein a vacuum pressure is applied through the perforations to hold the wafer and film against the IR window.

4. The apparatus of claim 1, wherein the film is made of silicon dioxide and deposited onto the IR window.

5. The apparatus of claim 1, further comprising at least one additional IR window having a different film of silicon dioxide, whereby the heating profile can be changed by substituting one IR window for another.

6. The apparatus of claim 1, wherein the film is made of silicon dioxide that is grown on a backside of the wafer.

7. The apparatus of claim 1, wherein the film is made of silicon dioxide having a thickness between one and three microns.

8. The apparatus of claim 1, wherein the scanner scans the beam in a serpentine pattern.

9. The apparatus of claim 1, wherein the scanner scans the beam in a raster pattern.

10. The apparatus of claim 9, wherein dwell time and energy of the beam is adjustable at each point on the raster pattern.

11. The apparatus of claim 10, further comprising:

means for measuring the temperature on the wafer at each point of the raster pattern; and adjusting dwell time and the energy of the beam at each point on the raster pattern to allow the measured temperature at the point to approach a desired temperature.

12. The apparatus of claim 1, further comprising means for measuring temperature of the wafer, wherein at least one of the dwell time and the energy of the beam is adjustable in response to the measured temperature.

13. The apparatus of claim 12, wherein the means for measuring the temperature includes a CCD camera.

14. The apparatus of claim 12, wherein the means for measuring the temperature includes:

means for reflecting a visible beam off the film;

an interferometer that determines displacement of the film according to the reflected beam; and a processor for determining the temperature of the film and the wafer as a function of the displacement.

15. The apparatus of claim 14, wherein the means for reflecting a visible beam off the film includes a probe laser.

16. The apparatus of claim 14, further comprising an additional window that is transmissive to the visible beam, and wherein the visible beam is directed through the additional window.

17. The apparatus of claim 1, further comprising a support having a surface upon which the film is formed, the support being interposed between the IR window and the wafer.

18. The apparatus of claim 17, wherein the support includes:

a silicon substrate having opposing first and second surfaces, the film being formed on the first surface; and at least one window in the substrate, extending from the first surface to the second surface, whereby the beam is scanned through at least one window and onto the film.

19. The apparatus of claim 18, wherein the film is made of silicon dioxide and deposited onto the support.

20. The apparatus of claims 17, further comprising at least one additional support having a different film, whereby the heating profile can be changed by substituting one support for another.

* * * * *